(12) United States Patent
Dai (10) Patent No.: US 11,094,895 B2
(45) Date of Patent: Aug. 17, 2021

(54) OLED DISPLAY SUBSTRATE, DISPLAY PANEL AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Weinan Dai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/621,477

(22) PCT Filed: May 24, 2019

(86) PCT No.: PCT/CN2019/088290
§ 371 (c)(1),
(2) Date: Dec. 11, 2019

(87) PCT Pub. No.: WO2019/223776
PCT Pub. Date: Nov. 28, 2019

(65) Prior Publication Data
US 2020/0176696 A1 Jun. 4, 2020

(30) Foreign Application Priority Data

May 24, 2018 (CN) .......................... 201810508950.3

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3246* (2013.01); *H01L 27/3276* (2013.01);
(Continued)

(58) Field of Classification Search
None
See application file for complete search history.

(56) References Cited

U.S. PATENT DOCUMENTS

2014/0218971 A1   8/2014   Wu
2015/0138041 A1   5/2015   Hirakata et al.
(Continued)

FOREIGN PATENT DOCUMENTS

CN   103971600 A   8/2014
CN   104317080 A   1/2015
(Continued)

OTHER PUBLICATIONS

Office Action dated Jun. 1, 2020 issued in corresponding Chinese Application No. 201810508950.3.

*Primary Examiner* — J. E. Schoenholtz
(74) *Attorney, Agent, or Firm* — Nath, Goldberg & Meyer; Joshua B. Goldberg (57) ABSTRACT

An OLED display substrate, an OLED display panel and manufacturing methods thereof are provided. The OLED display substrate includes a substrate including a main display region, plural side display regions outside plural edges of the main display region, respectively, and plural corner display regions outside every two adjacent edges of the main display region and around intersections of the every two adjacent edges, respectively; and plural display elements on the main display region, the plural side display regions, and the plural corner display regions of the substrate, respectively. At least the plural corner display regions of the substrate are made of a flexible material, plural (Continued)

openings are provided in each of the plural corner display regions, and each opening in each corner display region does not overlap any one of the display elements on the corner display region.

20 Claims, 6 Drawing Sheets

(51) Int. Cl.
    *H01L 51/52*     (2006.01)
    *H01L 51/56*     (2006.01)
(52) U.S. Cl.
    CPC ...... *H01L 27/3283* (2013.01); *H01L 27/3288* (2013.01); *H01L 51/524* (2013.01); *H01L 51/56* (2013.01); *H01L 2251/5338* (2013.01)

(56) References Cited

U.S. PATENT DOCUMENTS

| | | | |
|---|---|---|---|
| 2017/0045771 A1* | 2/2017 | Choi | ............... H01L 27/3258 |
| 2017/0162821 A1 | 6/2017 | Oh et al. | |
| 2018/0052493 A1* | 2/2018 | Hong | ............... G06F 3/0412 |

FOREIGN PATENT DOCUMENTS

| | | |
|---|---|---|
| CN | 104885140 A | 9/2015 |
| CN | 105977275 A | 9/2016 |
| CN | 106486598 A | 3/2017 |
| CN | 207008995 U | 2/2018 |
| CN | 107958636 A | 4/2018 |
| CN | 108766977 A | 11/2018 |
| JP | 2001196171 A | 7/2001 |
| KR | 20150136317 A | 12/2015 |

* cited by examiner

OLED DISPLAY SUBSTRATE, DISPLAY PANEL AND MANUFACTURING METHOD THEREOF

CROSS REFERENCE TO RELATED APPLICATIONS

This is a National Phase Application filed under 35 U.S.C. 371 as a national stage of PCT/CN2019/088290, filed on May 24, 2019, an application claiming the priority of Chinese patent application No. 201810508950.3, filed May 24, 2018, the contents of each of which are incorporated herein in their entirety by reference.

TECHNICAL FIELD

The present disclosure relates to the field of display technology, and particularly relates to an OLED display substrate, a display panel, a method for manufacturing an OLED display substrate, and a method for manufacturing a display panel.

BACKGROUND

An organic light emitting diode (OLED) display substrate has a self-luminous property and does not require a separate light source. Therefore, the OLED display substrate may be designed to be thinner and lighter, and thus wins the favor of the industry. If a substrate made of a flexible material is adopted in the OLED display substrate, the OLED display substrate may be applied to more applications. For example, a borderless mobile phone, a foldable product, a rollable product, and the like may be implemented.

SUMMARY

Embodiments of the present disclosure provide an OLED display substrate, an OLED display panel, a method for manufacturing an OLED display substrate, and a method for manufacturing an OLED display panel.

A first aspect of the present disclosure provides an OLED display substrate, including:

a substrate including a main display region, a plurality of side display regions outside a plurality of edges of the main display region, respectively, and a plurality of corner display regions outside every two adjacent edges of the main display region and around intersections of the every two adjacent edges, respectively; and a plurality of display elements on the main display region, the plurality of side display regions, and the plurality of corner display regions of the substrate, respectively;

wherein at least the plurality of corner display regions of the substrate are made of a flexible material, a plurality of openings are provided in each of the plurality of corner display regions, and each opening in each corner display region does not overlap any one of the display elements on the corner display region.

In an embodiment, the substrate is a flexible substrate, i.e., the entire substrate is made of a flexible material.

In an embodiment, the substrate is provided with first rigid skeletons between the main display region and each of the side display regions and between the main display region and each of the corner display regions, respectively, to support the flexible substrate.

In an embodiment, a second rigid skeleton, which is stretchable or compressible as an area of each of the openings of the substrate increases or decreases, is provided at a periphery of the opening.

In an embodiment, each of the first rigid skeletons is a rigid arc plate or a rigid arc strip.

In an embodiment, each second rigid skeleton is a rigid hexagonal frame.

In an embodiment, each first rigid skeleton or each second rigid skeleton is a rigid skeleton formed by hardening a flexible material of a portion of the substrate corresponding to the first rigid skeleton or the second rigid skeleton.

In an embodiment, a quantity of the openings in each corner display region of the substrate gradually decreases in a direction from an edge of the substrate to a center of the substrate.

In an embodiment, the substrate is provided with a protrusion at an edge of each of the openings.

In an embodiment, the OLED display substrate further includes electric wiring on the substrate, and the electric wiring is arranged around a periphery of the protrusion so as not to overlap any one of the openings.

In an embodiment, each of the display elements includes a pixel defining layer, and the protrusion is disposed in the same layer as the pixel defining layer.

In an embodiment, the plurality of openings in each of the corner display regions are arranged to be axisymmetric with respect to an axis of the corner display region, and the axis passes through a vertex corresponding to the corner display region and a center of the main display region.

In an embodiment, the plurality of openings in each of the corner display regions are arranged in a plurality of rows, and any two adjacent rows of openings are arranged in staggered positions.

In an embodiment, each of the openings is elliptic, rectangular, long strip shaped, triangular, or trapezoidal.

In an embodiment, in a case where each of the openings is rectangular, long strip shaped, triangular, or trapezoidal, each corner of each of the openings is a rounded corner.

In an embodiment, in a case where each of the openings is long strip shaped, both ends of the opening are provided with rounded corners, respectively, such that the rounded corner at each end of the opening has a diameter greater than that of a central portion of the opening.

A second aspect of the present disclosure provides a method for manufacturing an OLED display substrate, wherein the OLED display substrate is the OLED display substrate of any one of the above embodiments of the present disclosure, and the method includes:

forming the plurality of openings in each of the corner display regions of the substrate; and disposing the plurality of display elements at positions on the substrate other than the plurality of openings, respectively.

A third aspect of the present disclosure provides an OLED display panel, including an OLED display substrate and a cover plate disposed opposite to each other, wherein the OLED display substrate is the OLED display substrate of any one of the above embodiments of the present disclosure.

In an embodiment, the cover plate is a rigid cover plate having a plurality of sub-cover plates including a main sub-cover plate as a plane corresponding to the main display region, side sub-cover plates corresponding to the side display regions, respectively, and corner sub-cover plates corresponding to the corner display regions, respectively; wherein an outer surface of the main sub-cover plate is not parallel to an outer surface of each side sub-cover plate or an outer surface of each corner sub-cover plate.

A fourth aspect of the present disclosure provides a method for manufacturing an OLED display panel, wherein the OLED display panel includes the OLED display substrate of any one of the above embodiments of the present disclosure, and the method includes:

bending each side display region of the OLED display substrate relative to the main display region so as to attach the OLED display substrate to a cover plate, such that areas of the plurality of openings are reduced after the plurality of openings are compressed.

DETAILED DESCRIPTION

To enable one of ordinary skill in the art to better understand the technical solutions of the present disclosure, the present disclosure will be further described in detail below with reference to exemplary embodiments and the accompanying drawings.

It is desirable to provide a flexible or partially flexible OLED display substrate to facilitate implementation of a full screen. For example, a 3D (three-dimensional) cover plate with an arc profile (or referred to as a 3D curved cover plate) may be attached to the flexible or partially flexible OLED display substrate, to further enlarged a visible area of the formed OLED display panel, and a user may ignore the existence of the upper border, the lower border, the left border, and the right border of the OLED display panel.

Figure 1:
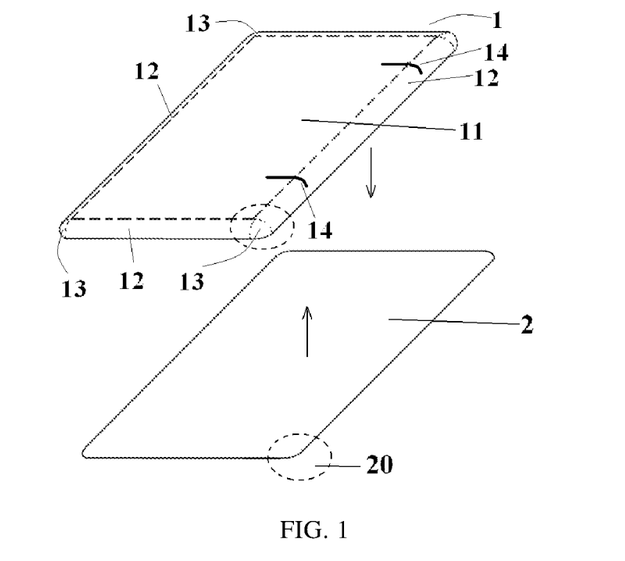
FIG. 1 is a schematic diagram showing an OLED display panel formed by attaching an OLED display substrate to a cover plate, according to an embodiment of the present disclosure.
Figure 2:
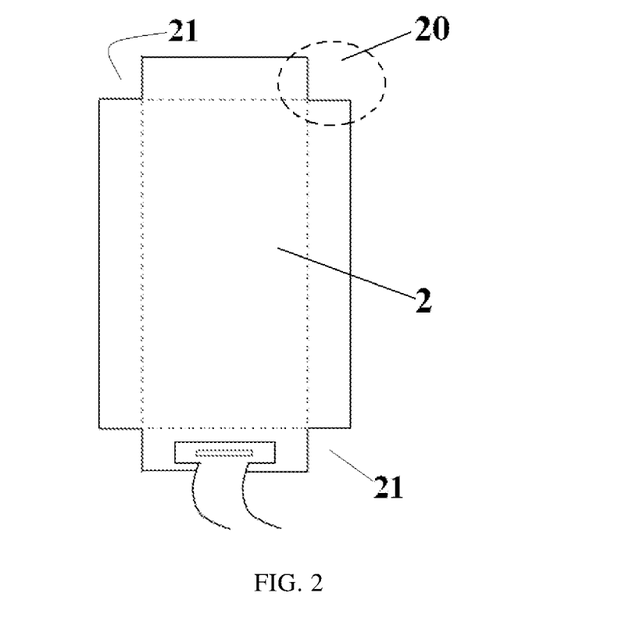
FIG. 2 is a schematic structural diagram of an OLED display substrate according to an embodiment of the present disclosure.

An embodiment of the present disclosure provides an OLED display panel including a cover plate 1 and a display substrate (e.g., OLED display substrate) 2, as shown in FIGS. 1 and 2. As shown in FIG. 1, the cover plate 1 may be a rigid cover plate including a plurality of sub-cover plates. The plurality of sub-cover plates may include a main sub-cover plate 11 positioned at a central portion of the cover plate 1, side sub-cover plates 12 positioned at outer sides of respective sides of the main sub-cover plate 11, and corner sub-cover plates 13 each of which is positioned between every two adjacent side sub-cover plates 12 of the side sub-cover plates 12. In an embodiment, the main sub-cover plate 11 is rectangular. In this case, the cover plate 1 includes four side sub-cover plates that are a left side sub-cover plate 12, a right side sub-cover plate 12, an upper side sub-cover plate 12, and a lower side sub-cover plate 12, and the cover plate 1 includes four corner sub-cover plates 13 respectively located at four vertexes (or corners) of the main sub-cover plate 11. In an embodiment, an outer surface of the main sub-cover plate 11 is not parallel to an outer surface of each of the side sub-cover plates 12 or each of the corner sub-cover plates 13. For example, as shown in FIG. 1, the outer surface of the main sub-cover plate 11 may have a planar shape, while the outer surface of each of the side sub-covers 12 and each of the corner sub-covers 13 may be bent with respect to the main sub-cover plate 11 toward the display substrate 2. In other words, the cover plate 1 may have an arc shape. Alternatively, in the cover plate 1, each of the side sub-cover plates 12 may be perpendicular or substantially perpendicular to the main sub-cover plate 11. The main sub-cover plate 11, each of the side sub-cover plates 12 and each of the corner sub-cover plates 13 of the cover plate 1 may have a display function.

As shown in FIG. 1, in an embodiment, the OLED display substrate 2 may be flexible and have a rectangular shape. When the OLED display substrate 2 is attached to the inside of the cover plate 1 (e.g., attached to the lower surface of the main sub-cover plate 11 of the cover plate 1 shown in FIG. 2), since the four corner sub-cover plates 13 of the cover plate 1 have the arc shape as described above, the four corners 20 of the OLED display substrate 2 will be pressed to be wrinkled, thereby deteriorating the display effect at the four corners 20.

In order to reduce or avoid the wrinkle phenomenon of the four corners 20 of the OLED display substrate 2, in an embodiment, a notch 21 is formed at each of the four corners 20 of the rectangular OLED display substrate 2, as shown in FIG. 2. Then, the OLED display substrate 2 having the notches 21 is attached to the inside of the cover plate 1. In this way, the wrinkle phenomenon of the four corners 20 of the OLED display substrate 2 can be reduced or avoided, thereby reducing or avoiding the deterioration of the display effect at the four corners 20. However, in a case where the size of each notch 21 is large, it may be difficult to achieve high-precision attaching, and high-precision arrangement of the electric wiring at each of the corners 20.

Figure 3:
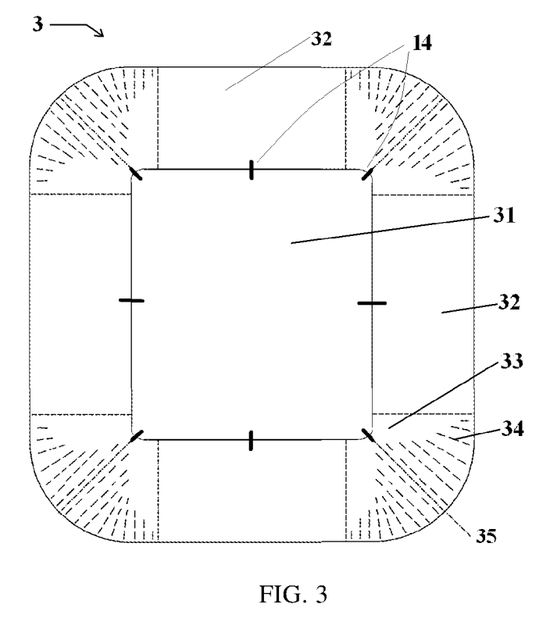
FIG. 3 is a schematic structural diagram of an OLED display substrate according to an embodiment of the present disclosure.
Figure 4:
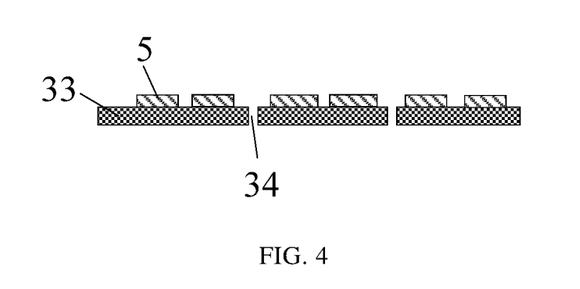
FIG. 4 is a schematic cross-sectional view showing a structure of a portion of an OLED display substrate according to an embodiment of the present disclosure.

An embodiment of the present disclosure provides an OLED display substrate, as shown in FIGS. 3 and 4. The OLED display substrate may include a substrate 3, and the substrate 3 includes a main display region 31, a plurality of side display regions 32 disposed respectively outside a plurality of edges of the main display region 31, and a plurality of corner display regions 33 each of which is located outside any two adjacent edges of the main display region 31 and around (or at) an intersection of the two adjacent edges. The OLED display substrate may further include a plurality of display elements 5, and the plurality of display elements 5 are disposed on the main display region 31, the plurality of side display regions 32, and a plurality of corner display regions 33 of the substrate 3, respectively. In an embodiment, at least the plurality of corner display regions 33 of the substrate 3 are made of a flexible material, a plurality of openings 34 are provided in each of the plurality of corner display regions 33, and each opening 34 in each corner display region 33 does not overlap any of the display elements 5 on the corner display region 33, as shown in FIG. 4.

In the OLED display substrate according to the present embodiment, the material of each corner display region 33 of the substrate 3 is a flexible material, and a plurality of openings 34 are formed in each corner display region 33, such that in a subsequent process of attaching the OLED display substrate to the cover plate 1 as shown in FIG. 1, the size of each corner display region 33 may be reduced due to the presence of the openings 34, and the OLED display substrate does not wrinkle. In addition, since each display element 5 does not overlap the position of each opening 34, the display function of the OLED display substrate is not affected.

An embodiment of the present disclosure provides an OLED display substrate, as shown in FIGS. 3 to 8. The OLED display substrate may include a flexible substrate 3 (i.e. the entire substrate 3 is made of a flexible material), and the display elements 5 provided on the substrate 3. The substrate includes the main display region 31, the side display regions 32 disposed respectively outside the plurality of edges of the main display region 31, and the corner display regions 33 disposed outside the plurality of edges of the main display region 31 and between every two adjacent side display regions 32. For example, each corner display region 33 is located outside any two adjacent edges of the main display region 31 and around (or at) the intersection of the two adjacent edges, and the plurality of openings 34 are provided in each corner display region 33. For example, each of the openings 34 does not overlap any of the display elements 5.

Figure 5A:
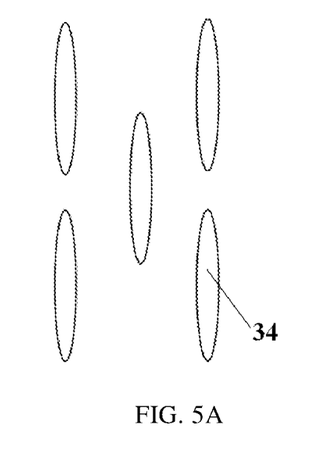
FIGS. 5A, 5B and 5C are schematic views showing structures and arrangement of openings formed in OLED display substrates according to embodiments of the present disclosure, respectively.
Figure 5B:
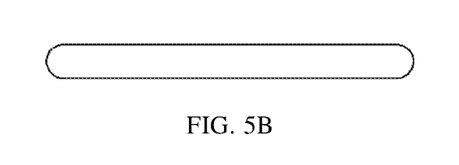
Figure 5C:
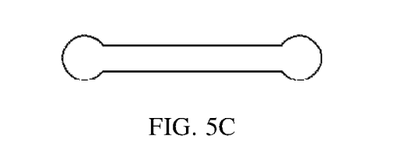

In the present embodiment, each opening 34 may be elliptic (e.g., as shown in FIG. 5A), rectangular or long strip shaped (as shown in FIGS. 5B and 5C). However, embodiments of the present disclosure are not limited thereto. For example, each opening 34 may also be triangular, trapezoidal, or of other shapes. In order to prevent a crack occurring in each opening 34 due to stress concentration when the opening 34 is stretched, each vertex (or corner) of each opening 34 may be formed as a rounded corner. For example, in the case where each opening 34 is a long strip, both ends of the long strip may be formed as rounded corners at the both ends, respectively, as shown in FIG. 5B. In addition, the rounded corner at each end of the long strip may have a diameter greater than a diameter of the central portion of the long strip to further enhance the effect of preventing a crack from occurring in each opening 34 when the opening 34 is stretched, as shown in FIG. 5C. The arrangement of the plurality of openings 34 in each corner display region 33 of the present embodiment may be axisymmetrically distributed about an axis 35 of the corner display region 33, and the axis 35 may pass through a vertex corresponding to the corner display region 33 and a central point (e.g., a geometric center point) of the main display region 31, as shown in FIG. 3. In an embodiment, the plurality of openings 34 in each corner display region 33 are arranged in a plurality of rows, and any two adjacent rows of openings 34 are arranged in staggered positions, such that the corner display region 33 may have a uniform display effect when being stretched or compressed, as shown in FIG. 5A. However, embodiments of the present disclosure are not limited thereto. For example, the arrangement of the plurality of openings 34 in each corner display region 33 may be irregular. As described above, the substrate 3 of the OLED display substrate of the present embodiment is made of a flexible material, and the flexible material may be an elastic material, such as polydimethylsiloxane (PDMS), or other flexible and bendable polymer material. The OLED display substrate may be applied to a curved display panel.

In an embodiment, in the case where the substrate 3 is made of a flexible material having a good bending deformation property, in order to facilitate the formation of the display elements 5 and the like on the substrate 3, a first rigid skeleton 14 (such as shown in FIG. 3) may be provided to be connected between the main display region 31 and each side display region 32 and/or between the main display region 31 and each corner display region 33 of the substrate 3, for supporting the flexible substrate 3.

For example, each first rigid skeleton 14 functions to make the softer flexible substrate 3 rigid at a desired portion, thereby supporting the substrate 3 to have a predetermined shape. For example, when the OLED display substrate is applied to a curved display device, a position required to have a curvature may be provided with the first rigid skeleton(s) 14 having the corresponding curvature to support the flexible substrate 3 to have the curvature. In an embodiment, each first rigid skeleton 14 may be a rigid arc plate or a rigid arc band, and may be made of plastic, metal, or the like. Alternatively, each first rigid skeleton 14 may be formed as, for example, the rigid arc plate or the rigid arc band by performing a hardening process on the corresponding portion of the flexible substrate 3, and the hardening process may be, for example, an ultraviolet ozone photolysis process ($UV/O_3$ process).

Figure 6:
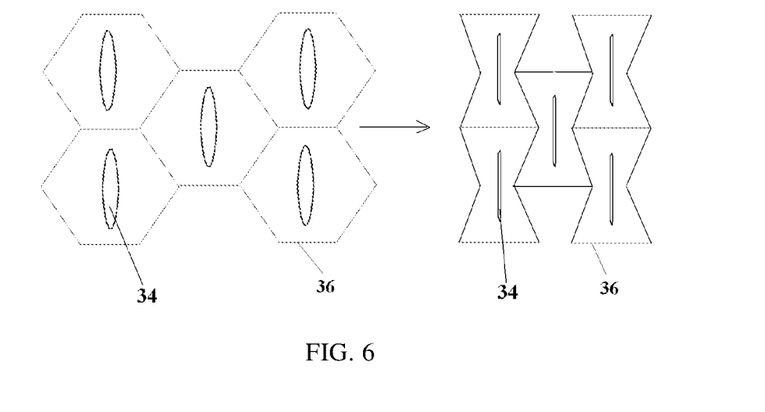
FIG. 6 is a schematic view showing structures of openings and rigid skeletons formed in an OLED display substrate according to an embodiment of the present disclosure and deformation of the openings and the rigid skeletons under an external force.

In an embodiment, a second rigid skeleton 36 that is stretchable or compressible as the area of each opening 34 in the substrate 3 increases or decreases may be provided at the edge position of (or around) the opening 34.

For example, as shown in FIG. 6, each of the second rigid skeletons 36 may be a hexagonal frame including six sides made of a rigid material and connected to each other, and any two adjacent sides of the six sides may be connected to each other by a hinge, for example. Alternatively, each second rigid skeleton 36 may be formed, for example, in a hexagonal shape by performing a hardening process on a portion of the flexible substrate 3 around the corresponding opening 34, and the hardening process may be, for example, the ultraviolet ozone photolysis process ($UV/O_3$ process). Each opening 34 is provided in a corresponding one of the hexagonal frames (i.e., the second rigid skeletons 36). When each opening 34 is stretched or compressed, the six sides of the corresponding second rigid skeleton 36 rotate at the intersection of two adjacent sides to change an angle between the two adjacent sides, such that the hexagonal frame deforms as the opening 34 deforms. This configuration allows on one hand a controllable stretching or compression of the area of each opening 34 and on the other hand a support to the substrate 3.

Figure 12:
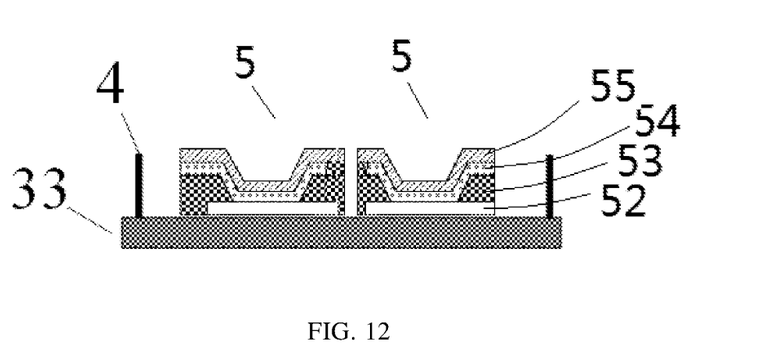
FIG. 12 is a schematic enlarged view of a portion (e.g., a central portion) of the structure shown in FIG. 7.

It should be noted that each display element 5 in the present embodiment may generally include: a pixel defining layer 53 having a plurality of pixel defining structures. The pixel defining structures define a plurality of pixel units, and each pixel unit may include an anode 52, a cathode 55, and an organic light emitting layer 54 disposed between the anode 52 and the cathode 55, as shown in FIG. 12. In an embodiment, the OLED display substrate may further include a functional structure, such as electric wiring 51, a waterproof layer (not shown), a planarization layer (not shown) and the like, provided on the substrate 3. For example, the electric wiring 51 may provide display signals to different display elements 5.

Figure 7:
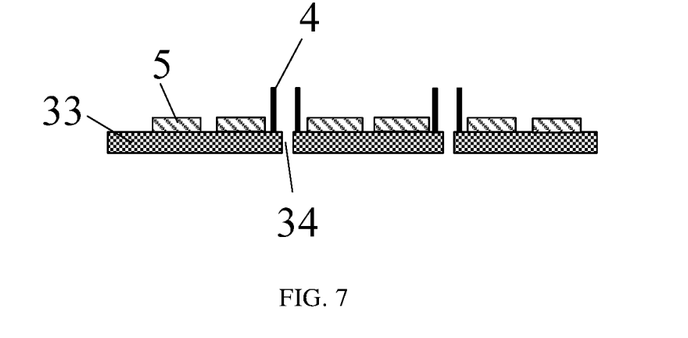
FIG. 7 is a schematic cross-sectional view showing a portion of an OLED display substrate according to an embodiment of the present disclosure.
Figure 8:
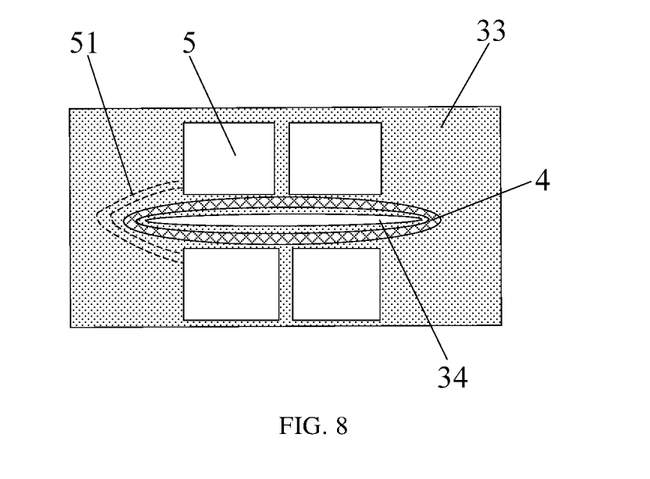
FIG. 8 is a schematic top view showing a portion of an OLED display substrate according to an embodiment of the present disclosure.

In an embodiment, as shown in FIGS. 7 and 8, the substrate 3 is provided with protrusions 4 at peripheral positions around the respective openings 34. For example, the protrusions 4 may be provided in the same layer as the pixel defining layer 53, as shown in FIG. 12. Alternatively, the protrusions 4 may be provided in the same layer as the planarization layer.

That is, the protrusions 4 may be formed when forming a structural layer such as the planarization layer, the pixel defining layer, or the like, such that when the waterproof layer (not shown) is formed, the waterproof layer (which is made of, for example, an inorganic material) and the protrusions 4 form a dam structure for proofing water and oxygen. That is, the protrusions 4 in the present embodiment may serve as a dam to prevent water and oxygen from entering into the interior of the OLED display substrate, so as to prevent the display elements 5 from being corroded by water and oxygen.

In an embodiment, the electric wiring 51 is arranged around the outer side of the protrusions 4 such that each of the openings 34 does not overlap the electric wiring 51.

That is, referring to FIG. 8, each protrusion 4 of the present embodiment is arranged around the corresponding opening 34, and each protrusion 4 may not only prevent water and oxygen from entering into the interior of the OLED display substrate, but also serve as a routing wall for the electric wiring 51, so as to ensure that the electric wiring 51 is located on the substrate 3. Therefore, even when the OLED display substrate is pressed and a corresponding opening 34 is compressed, the electric wiring 51 will not be affected, and poor contact or disconnection of the electric wiring 51 will not occur.

Figure 9:
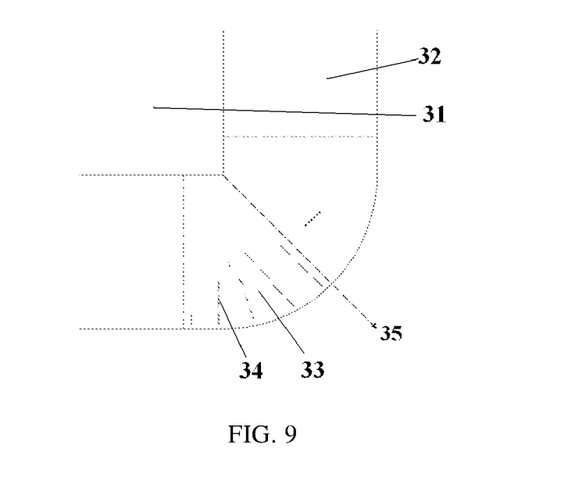
FIG. 9 is a schematic top view showing a portion of an OLED display substrate according to an embodiment of the present disclosure.

In an embodiment, the number (i.e., quantity) of openings 34 in each of the corner display regions 33 of the substrate 3 gradually decreases in a direction from the edge of the substrate 3 to the center of the substrate 3.

Referring to FIG. 9, in a subsequent process of attaching the OLED display substrate to the cover plate 1, an amount of compressed deformation of each of the corner display regions 33 is maximal at the edge of the substrate 3 and is gradually reduced in the direction from the edge of the substrate 3 to the center of the substrate 3. Therefore, the number of the openings 34 formed in each of the corner display regions 33 of the substrate 3 is gradually decreased in the direction from the edge of the substrate 3 to the center of the substrate 3.

For example, when the main display region 31 is rectangular, the plurality of corner display regions 33 may be symmetric with respect to the center (e.g., a geometric center) of the main display region 31, and the arrangements of the respective openings 34 in the plurality of corner display regions 33 may also be symmetric with respect to the center of the main display region 31.

Figure 10:
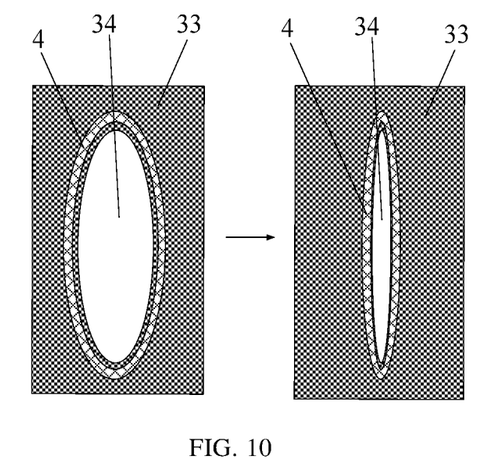
FIG. 10 is a schematic view showing compression of a portion of an OLED display substrate according to an embodiment of the present disclosure.

For example, a size of each opening 34 may be adjusted according to a size of the actual OLED display substrate, and it may alternatively be changed according to the amount of deformation before and after compression of each of the corner display regions 33 and the number of openings 34. For example, as shown in FIG. 3, before the substrate 3 is attached to the cover plate 1, the outermost edge of the substrate 3 has a perimeter x, the substrate 3 is to be placed into the cover plate 1 having a perimeter y at a corresponding position, and the number of the openings 34 provided at the outermost edge of each corner display region 33 of the substrate 3 is n. In this case, a size of each of the openings 34 provided at the outermost edge is (x−y)/(4×n). Thus, when the substrate 3 (or the OLED display substrate 2) is attached to the cover plate 1, each opening 34 is pressed, as shown in FIG. 10, such that gaps at the upper and lower edges of the opening 34 approaches 0, thereby obtaining the best display effect.

It should be understood that the size, thickness, and the like of each structural layer shown in the drawings corresponding to the embodiments of the present disclosure are merely schematic. In the process implementation, the projection areas of the structural layers on the substrate 3 may be identical or different, and the required projection areas of the structural layers may be implemented by an etching process. Meanwhile, the structures shown in the drawings are not limited to the geometric shapes of the respective structural layers, and may be, for example, a rectangle as shown in the drawings, a trapezoid, or other shapes formed by etching.

Embodiments of the present disclosure provide a method for manufacturing the OLED display substrate, including the following manufacturing steps S1a, S1b, and S2.

In step S1a, a plurality of openings 34 is formed in each of the corner display regions 33 of the substrate 3.

The shape and arrangement of the openings may be as described above, and will not be repeated here.

In step S1b, a protrusion 4 is formed at a peripheral position around each of the openings 34. It should be understood that step S1b is not necessary, but is optional.

In step S2, a plurality of display elements 5 are formed on the substrate 3 such that the plurality of display elements 5 are disposed on the main display region 31, the plurality of side display regions 32, and the plurality of corner display regions 33 of the substrate 3, respectively. Each display element 5 in the present embodiment may generally include: the pixel definition layer provided with the plurality of pixel defining structures which define a plurality of pixel units. Each of the pixel units may include an anode, a cathode and an organic light emitting layer arranged between the anode and the cathode. In an embodiment, each display element 5 may further include a functional structure such as circuit pathways, a waterproof layer, a planarization layer, and/or the like.

For example, the protrusions 4 may be formed simultaneously with the formation of the planarization layer, the pixel defining layer, or other structural layers, such that when an inorganic waterproof layer is formed the inorganic waterproof layer and the protrusions 4 will form a dam structure for proofing water and oxygen.

It should be noted that, in a case where the substrate 3 is a flexible substrate, the substrate 3 may be first placed on a support (e.g., a glass plate) to complete the manufacturing of the openings 34 and the display elements 5. After the manufacturing of the display elements 5 and the like is completed, the flexible substrate 3 is peeled off from the support.

Embodiments of the present disclosure provide a display panel (e.g., an OLED display panel) including an OLED display substrate 2 and a cover plate 1 disposed opposite to each other, and the configurations of the OLED display substrate 2 and the cover plate 1 may be as described above.

Figure 11:
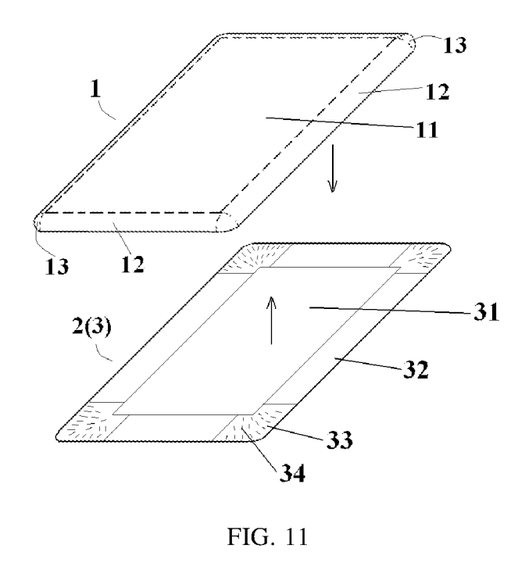
FIG. 11 is a schematic structural diagram of a display panel according to an embodiment of the present disclosure.

As shown in FIG. 11, in the present embodiment, each corner display region 33 of the substrate 3 of the OLED display substrate 2 is made of a flexible material, and a plurality of openings 34 are formed in each corner display region 33. In a subsequent process of attaching the OLED display substrate 2 to the cover plate 1, the size of each corner display region 33 may be reduced due to the presence of the openings 34, such that the OLED display substrate is free from wrinkles. In addition, since each display element 5 does not overlap any one of the openings 34, the display function of the OLED display substrate is not affected.

As described above, the cover plate 1 is a rigid cover having a plurality of sub-cover plates including the main sub-cover plate 11 as a plane corresponding to the main display region 31, the side sub-cover plates 12 corresponding to the side display regions 32, respectively, and the corner sub-cover plates 13 corresponding to the corner display regions 33, respectively. For example, the outer surface of the main sub-cover plate 11 is not parallel to the outer surface(s) of each of the side sub-cover plates 12 and/or each of the corner sub-cover plates 13. For example, the cover plate 1 in FIG. 11 may be the same as the cover plate 1 in FIG. 1.

Thus, the cover plate 1 may have an arc shape. Alternatively, each of the four side sub-cover plates 12 of the cover plate 1 may be perpendicular or substantially perpendicular to the main sub-cover plate 11. The above method may be applied to an electronic device with four sides having a display function.

Embodiments of the present disclosure provide a method for manufacturing an OLED display panel, including the following manufacturing steps.

Each side display region 32 and/or each corner display region 33 of the substrate 3 of the OLED display substrate 2 of each of the above-described embodiments is bent with respect to the main display region 31, and then the OLED display substrate 2 is attached to the cover plate 1 (e.g., to the lower surface of the cover plate 1 shown in FIG. 11) such that the plurality of openings 34 in each corner display region 33 are compressed to reduce their areas.

For example, the step of attaching the OLED display substrate 2 to the cover plate 1 may include the following steps:

aligning the main display region 31 with the main sub-cover plate 11 and attaching the main display region 31 to the main sub-cover plate 11;

then, aligning the side display regions 32 with the side sub-cover plates 12 and attaching the side display regions 32 to the side sub-cover plates 12, wherein when the four side display regions 32 are attached and fixed to the four side sub-cover plates 12, the compression of the openings 34 of the four corner display regions 33 (i.e., the four corners of the substrate 3) is completed, so as to match the sizes of the four corners of the OLED display substrate 2 to the size of the cover plate 1; and finally, attaching and fixing the four corners of the display substrate 2 to the four corners of the cover plate 1.

Embodiments of the present disclosure provide a display device (e.g., an OLED display device) including the OLED display panel provided in any one of the above embodiments. The display device may be any product or component with a display function, such as electronic paper, a mobile phone, a tablet computer, a television, a display, a notebook computer, a digital photo frame, a navigator, or the like.

It is to be understood that the above embodiments are merely exemplary embodiments for explaining the principles of the present disclosure, and the present disclosure is not limited thereto. It will be apparent to one of ordinary skill in the art that various changes and modifications may be made therein without departing from the spirit and essence of the present disclosure, and these changes and modifications also fall within the scope of the present disclosure.

What is claimed is:

1. An OLED display substrate, comprising:
a substrate comprising a main display region, a plurality of side display regions outside a plurality of edges of the main display region, respectively, and a plurality of corner display regions outside every two adjacent edges of the main display region and around intersections of the every two adjacent edges, respectively; and
a plurality of display elements on the main display region, the plurality of side display regions, and the plurality of corner display regions of the substrate, respectively;
wherein at least the plurality of corner display regions of the substrate are made of a flexible material, a plurality of openings are provided in each of the plurality of corner display regions, and each opening in each corner display region does not overlap any one of the display elements on the corner display region; and
wherein a quantity of the openings in each corner display region of the substrate decreases in a direction from an edge of the substrate to a center of the substrate.

2. The OLED display substrate of claim 1, wherein the substrate is a flexible substrate.

3. The OLED display substrate of claim 2, wherein the substrate is provided with first rigid skeletons between the main display region and each of the side display regions and between the main display region and each of the corner display regions, respectively, to support the flexible substrate.

4. The OLED display substrate of claim 2, wherein a second rigid skeleton, which is stretchable or compressible as an area of each of the openings of the substrate increases or decreases, is provided at a periphery of the opening.

5. The OLED display substrate of claim 3, wherein each of the first rigid skeletons is a rigid arc plate or a rigid arc strip.

6. The OLED display substrate of claim 4, wherein the second rigid skeleton is a rigid hexagonal frame.

7. The OLED display substrate of claim 3, wherein each first rigid skeleton or each second rigid skeleton is a rigid skeleton formed by hardening a flexible material of a portion of the substrate corresponding to the first rigid skeleton or the second rigid skeleton.

8. An OLED display substrate, comprising:
a substrate comprising a main display region, a plurality of side display regions outside a plurality of edges of the main display region, respectively, and a plurality of corner display regions outside every two adjacent edges of the main display region and around intersections of the every two adjacent edges, respectively; and
a plurality of display elements on the main display region, the plurality of side display regions, and the plurality of corner display regions of the substrate, respectively;
wherein at least the plurality of corner display regions of the substrate are made of a flexible material, a plurality of openings are provided in each of the plurality of corner display regions, and each opening in each corner display region does not overlap any one of the display elements on the corner display region; and
the OLED display substrate further comprises a protrusion at an edge of each of the openings on the substrate.

9. The OLED display substrate of claim 8, further comprising electric wiring on the substrate, and the electric wiring is arranged around a periphery of the protrusion so as not to overlap any one of the openings.

10. The OLED display substrate of claim 8, wherein each of the display elements comprises a pixel defining layer, and the protrusion is disposed in the same layer as the pixel defining layer.

11. The OLED display substrate of claim 1, wherein the plurality of openings in each of the corner display regions are arranged to be axisymmetric with respect to an axis of the corner display region, and the axis passes through a vertex corresponding to the corner display region and a center of the main display region.

12. An OLED display substrate, comprising:
a substrate comprising a main display region, a plurality of side display regions outside a plurality of edges of the main display region, respectively, and a plurality of corner display regions outside every two adjacent edges of the main display region and around intersections of the every two adjacent edges, respectively; and
a plurality of display elements on the main display region, the plurality of side display regions, and the plurality of corner display regions of the substrate, respectively;
wherein at least the plurality of corner display regions of the substrate are made of a flexible material, a plurality of openings are provided in each of the plurality of corner display regions, and each opening in each corner display region does not overlap any one of the display elements on the corner display region; and
wherein the plurality of openings in each of the corner display regions are arranged in a plurality of rows, and any two adjacent rows of openings are arranged in staggered positions.

13. The OLED display substrate of claim 1, wherein each of the openings is elliptic, rectangular, long strip shaped, triangular, or trapezoidal.

14. The OLED display substrate of claim 13, wherein in a case where each of the openings is rectangular, long strip shaped, triangular, or trapezoidal, each corner of each of the openings is a rounded corner.

15. The OLED display substrate of claim 14, wherein in a case where each of the openings is long strip shaped, both ends of the opening are provided with rounded corners, respectively, such that the rounded corner at each end of the opening has a diameter greater than that of a central portion of the opening.

16. A method for manufacturing an OLED display substrate, wherein the OLED display substrate is the OLED display substrate of claim 1, and the method comprises:
forming the plurality of openings in each of the corner display regions of the substrate; and
disposing the plurality of display elements at positions on the substrate other than the plurality of openings, respectively.

17. An OLED display panel, comprising an OLED display substrate and a cover plate disposed opposite to each other, wherein the OLED display substrate is the OLED display substrate of claim 1.

18. The OLED display panel of claim 17, wherein the cover plate is a rigid cover plate having a plurality of sub-cover plates including a main sub-cover plate as a plane corresponding to the main display region, side sub-cover plates corresponding to the side display regions, respectively, and corner sub-cover plates corresponding to the corner display regions, respectively; wherein an outer surface of the main sub-cover plate is not parallel to an outer surface of each side sub-cover plate or an outer surface of each corner sub-cover plate.

19. A method for manufacturing an OLED display panel, wherein the OLED display panel comprises the OLED display substrate of claim 1, and the method comprises:
bending each side display region of the OLED display substrate relative to the main display region so as to attach the OLED display substrate to a cover plate, such that areas of the plurality of openings are reduced after the plurality of openings are compressed.

20. An OLED display panel, comprising an OLED display substrate and a cover plate disposed opposite to each other, wherein the OLED display substrate is the OLED display substrate of claim 8.

* * * * *